United States Patent

Himes et al.

[11] Patent Number: 6,046,886
[45] Date of Patent: Apr. 4, 2000

[54] FLEX CIRCUIT HEAD INTERCONNECT WITH INSULATING SPACER

[75] Inventors: Adam K. Himes, Richfield; Kevin J. Schulz, Apple Valley; David A. Sluzewski, Edina; David G. Qualey, Apple Valley, all of Minn.

[73] Assignee: Seagate Technology, Inc., Scotts Valley, Calif.

[21] Appl. No.: 09/076,164

[22] Filed: May 12, 1998

Related U.S. Application Data

[60] Provisional application No. 60/061,648, Oct. 9, 1997.

[51] Int. Cl.⁷ ........................................... G11B 5/48
[52] U.S. Cl. ................................................. 360/104
[58] Field of Search ................................. 360/104, 97.01

[56] References Cited

U.S. PATENT DOCUMENTS

| | | | |
|---|---|---|---|
| 4,336,529 | 6/1982 | Buan | 340/365 R |
| 4,691,972 | 9/1987 | Gordon | 439/77 |
| 4,819,094 | 4/1989 | Oberg | 360/104 |
| 5,161,074 | 11/1992 | Forbord | 360/104 |
| 5,805,377 | 9/1998 | Lerdal | 360/104 |
| 5,844,753 | 12/1998 | Inaba | 360/104 |
| 5,862,010 | 1/1999 | Simmons | 360/104 |
| 5,883,759 | 3/1999 | Schulz | 360/104 |

*Primary Examiner*—A. J. Heinz
*Attorney, Agent, or Firm*—Westman, Champlin & Kelly, P.A.

[57] ABSTRACT

A disc drive flex circuit head interconnect includes a base insulating layer. At least one flexible electrical conductor is attached to the base insulating layer. The electrical conductor has first and second ends, the first end is adapted to couple to a head, and a second end adapted to couple to an actuator board through a slot in the actuator board. An insulating spacer covers at least a portion of the electrical conductor and extends beyond at least one edge of the base insulating layer near the second end of the conductor. A disc drive incorporating the interconnect and a method of interconnection is also provided.

19 Claims, 6 Drawing Sheets

FLEX CIRCUIT HEAD INTERCONNECT WITH INSULATING SPACER

CROSS REFERENCE TO RELATED APPLICATION

This application claims the priority of an earlier filed co-pending provisional application Ser. No. 60/061,648, filed Oct. 9, 1997, entitled METHOD TO PREVENT SHORTING OF FLEX HEAD INTERCONNECT.

BACKGROUND OF THE INVENTION

The present invention relates to disc drive storage devices. More specifically, the present invention relates to a method and apparatus for preventing shorting of a flex circuit head interconnect in a disc drive.

Disc drives are the primary devices employed for mass storage of computer programs and data used in computer systems. Within a disc drive, a load beam supports a hydrodynamic air bearing (or slider) proximate a rotating magnetic disc. The load beam supplies a downward force that counteracts the hydrodynamic lifting force developed by the air bearing. The slider carries a magnetic transducer for communicating with individual positions on the rotating magnetic disc.

In disc drives, it is necessary to electrically couple the magnetic transducer, which is located on the slider above the disc surface, to the electronic circuitry of a disc drive. Traditionally, such interconnection had been effected by running very small wires down the load beam to the magnetic transducer. Although such an approach did create the required electrical connection, it required manual positioning of each individual, fine, wire.

More recently, the interconnection between the magnetic transducer on the head and the disc drive circuitry, has been effected by using flexible circuitry. A flexible circuit (flex circuit) consists of copper traces attached to a polyimide base film. Often, a copper layer is bonded to the polyimide film which copper layer is selectively removed to leave behind copper traces, through conventional photo etch processing. It is common in the flex circuit industry to apply a cover dielectric layer over the copper traces in order to insulate the traces. There are a number of ways to apply such a cover dielectric layer. First, an adhesive coated polyimide film may be laminated to the circuit such that the circuit is essentially sandwiched between the two polyimide films. Alternatively, a cover coat material may be applied as a liquid or laminated as a dry film to the circuit which is then patterned using conventional photo processes.

Although the use of flex circuits for electrical connection between the transducer and the disc drive circuitry has simplified disc drive fabrication, the application of a flex circuit to a head interconnect in a disc drive suffers from limitations.

SUMMARY OF THE INVENTION

A disc drive flex circuit head interconnect includes a base insulating layer. At least one flexible electrical conductor is attached to the base insulating layer. The electrical conductor has first and second ends, the first end is adapted to couple to a head, and a second end adapted to couple to an actuator board through a slot in the actuator board. An insulating spacer covers at least a portion of the electrical conductor and extends beyond at least one edge of the base insulating layer near the second end of the conductor. A disc drive incorporating the interconnect and a method of interconnection is also provided.

DETAILED DESCRIPTION OF THE PREFERRED EMBODIMENTS

Figure 1:
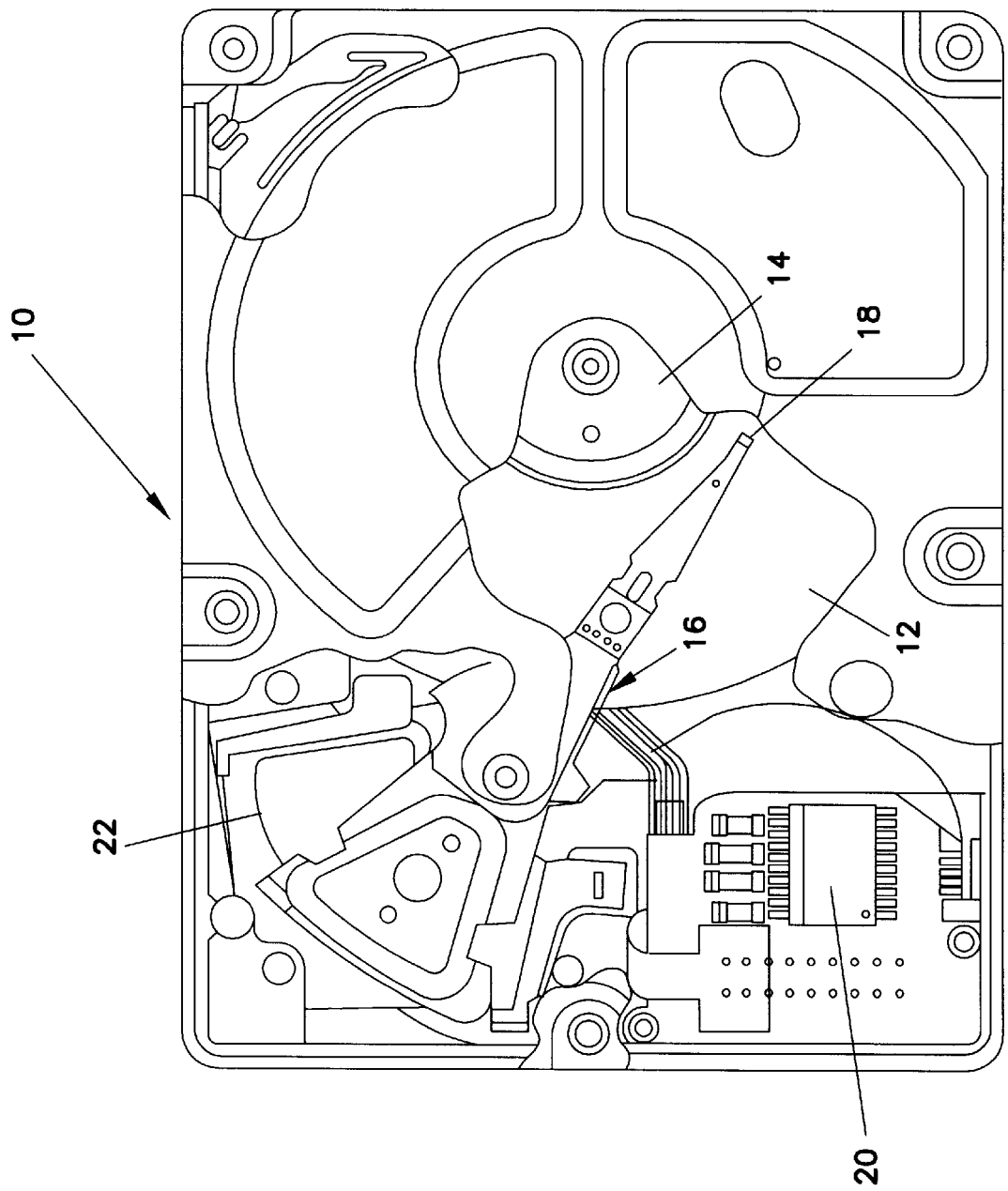
FIG. 1 is a diagrammatic view of storage drive 10 in accordance with the present invention.

FIG. 1 is a diagrammatic view of storage drive 10 in accordance with the present invention. Storage drive 10 is coupled to a computer (not shown) such that the computer transfers data to and reads data from storage drive 10. Storage drive 10 includes disc 12, spindle 14, load arm 16, head 18, control circuitry 20 and actuator 22.

Disc 12 is fixed about spindle 14. Spindle 14 is coupled to a spindle motor (not shown) such that energization of the spindle motor causes spindle 14 and disc 12 to rotate. When disc 12 rotates, head 18 flies above disc 12 and is magnetically or optically coupled to the surface of disc 12. Actuator 22 is coupled to disc controller 20 and is adapted to move transducer head 18 across the surface of disc 12 in response to an actuation signal from disc controller 20. In addition to controlling actuator 22, disc controller 20 is electrically coupled to head 18 to read and write data to the surface of disc 12. As is commonly the case, there is generally more than one disc 12 in a given disc drive 10. As such, multiple load arms 16 and heads 18 reside in a given disc drive 10.

Figure 2:
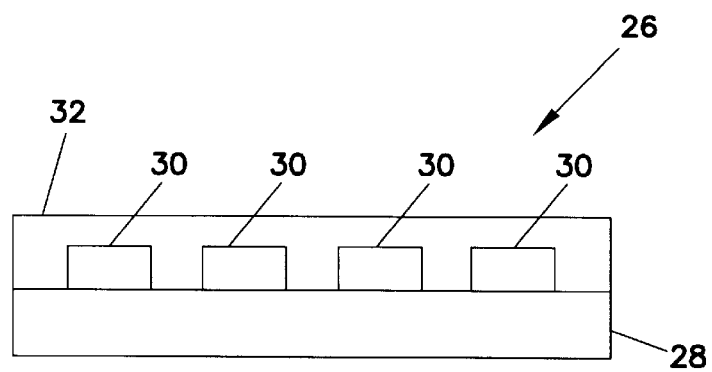
FIG. 2 is a cross-section view of a typical flex circuit.

FIG. 2 is a cross-section view of a typical flex circuit 26. Flex circuit 26 is shown in FIG. 2 in order to briefly describe various elements of flex circuits in general. Specifically, flex circuit 22 includes base dielectric layer 28, conductors 30, and cover dielectric layer 32. Generally, flex circuits such as flex circuit 26 are constructed by bonding a layer of conductive material, such as copper, to a dielectric material. Then using known techniques, the stack up of conductive material and dielectric material is processed in order to selectively remove conductive material and leave a desired circuit trace therebehind. Finally, a cover dielectric layer, such as cover dielectric layer 32 is applied to the stack up of conductors 30 and substrate dielectric layer 28 in order to complete flex circuit 26.

Figure 3:
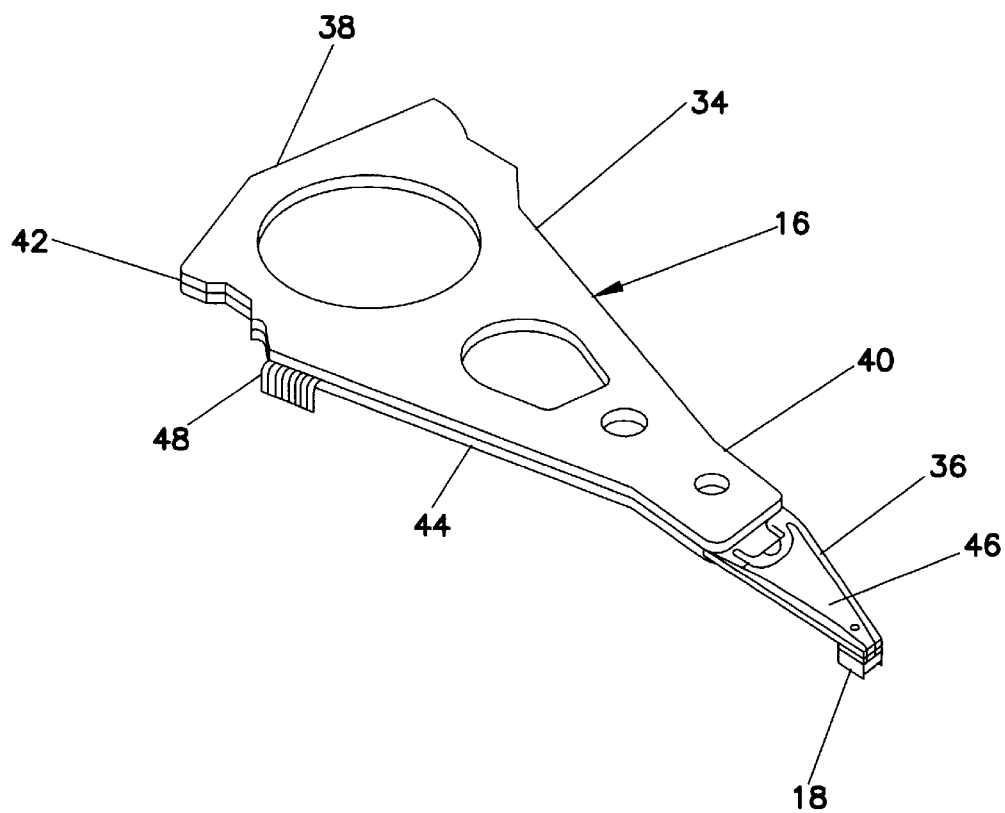
FIG. 3 is a perspective view of a suspension assembly.

FIG. 3 is a perspective view of suspension assembly 16 with head 18. Suspension assembly 16 includes load arm 34, and flexure arm 36. Load arm 34 is one of generally multiple load arms in an E-block assembly (not shown). Load arm 34 includes actuator portion 38, and flexure arm attach region 40. Further, load arm 34 also includes side wall 32 which extends around the parameter of load arm 34. Load arm 34 includes groove 44 (shown in FIG. 4) which is disposed in side wall 42 running along side wall 42. FIG. 3 also shows flex circuit 46 which is disposed on flexure arm 46 and in groove 44. Flex circuit 46 couples electrically to magnetic transducers on head 18. Further, conductors (not shown in FIG. 3) within flex circuit 46 extend from head 18 to matrix board attach region 48.

Figure 4:
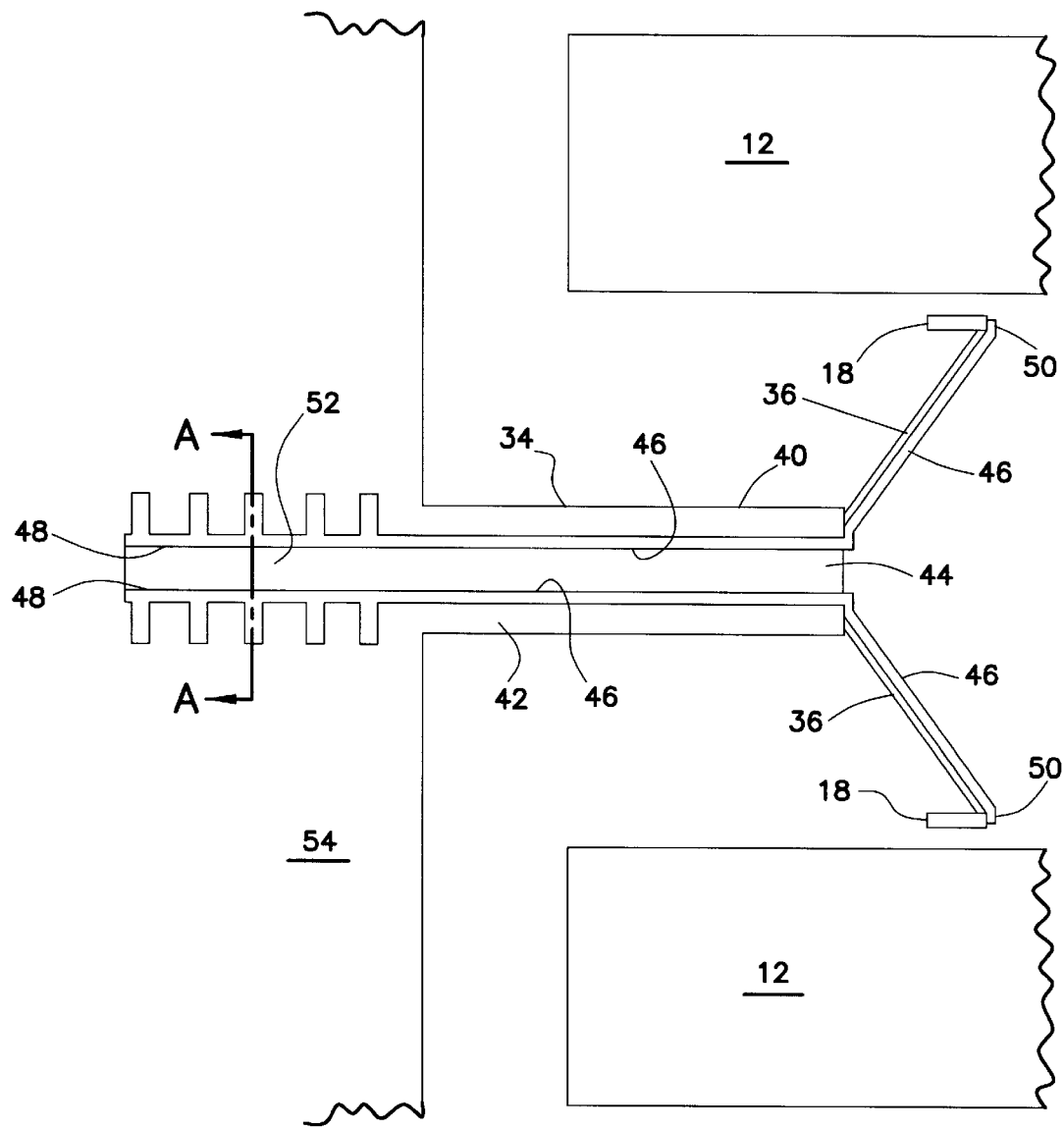
FIG. 4 is an elevation view of a load arm disposed between two discs in a disc drive in accordance with the present invention.

FIG. 4 is an elevation view of load arm 34 disposed between two discs 12 in a disc drive. As can be seen, in FIG.

4 load arm 34 is coupled generally to two flexure arms 36 which support heads 18 between discs 12. This multiple head arrangement was not shown in FIG. 3, in order to enhance clarity. As can be seen in FIG. 4, flexure arms 36 extend from flexure attach region 40 of load arm 34 to locations proximate discs 12. Heads 18 are coupled to flexure arms 36 proximate discs 12. FIG. 4 also shows flex circuits 46 electrically coupling heads 18 through conductors 50. It should be noted that the flex circuits required for head interconnects are minute and have tight dimensional tolerances for flex circuit manufacturing. For example, leads 50 which electrically couple to heads 18 generally have a width of 75 μm.

As stated earlier, flex circuits 46 run in groove 44 on side wall 42 of load arm 34. Upon reaching end 52 of groove 44, flex circuits 46 electrically connect to actuator board 54 through a slot 55 (shown in FIGS. 5A and 5B) in actuator board 54 a portion of which is shown in FIG. 4. Currently, flex circuit manufacture is limited to such an extent that laminated cover films cannot be patterned and aligned practically for circuits of these dimensions. As a result, photo imagineable cover coat materials are required for the cover dielectric layer. However, cover coat materials and the process to apply and define them on the circuit can be expensive. Further, the materials themselves must be chemically compatible with the disc drive (contain no silicones) and have low outgassing and ionic contamination. In addition, cover coats must be flexible and environmentally stable. Finally, the patterning process must be able to achieve high accuracy and precision in addition to providing a small feature size, and the cost must be minimized. As a result, there is a desire to eliminate the cover coat completely which is motivated by cost and material considerations. The elimination of the cover coat yields a flex circuit which is comprised of a dielectric substrate on which various conductors are bonded.

Figure 5A:
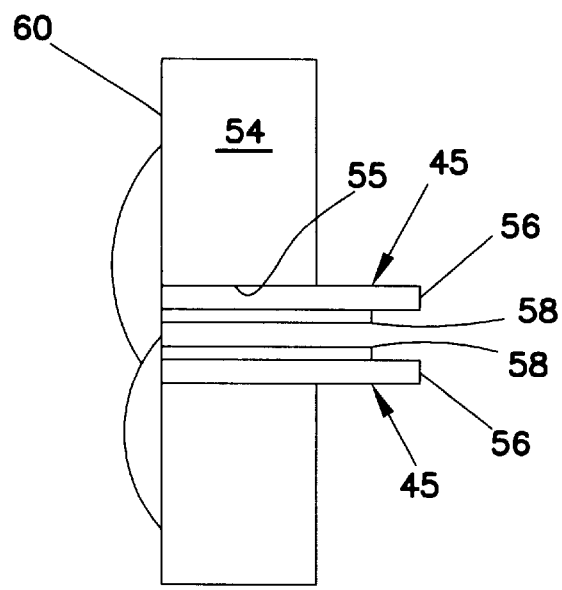
FIG. 5A is an elevation view of flex circuits mounting to an actuator board, in accordance with the prior art.
Figure 5B:
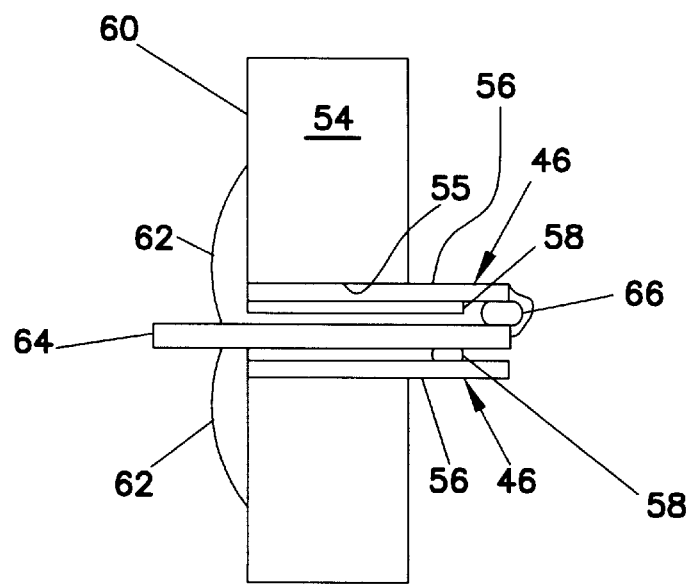
FIG. 5B is an elevation view of flex circuits mounting to an actuator board, in accordance with the present invention.

FIGS. 5A and 5B are elevation views of flex circuits coupling actuator board 54 as taken along section A—A in FIG. 4. As used herein, actuator board 54 may also be referred to as matrix board 54. FIG. 5A represents the prior art. FIG. 5A shows a pair of flex circuits 45 passing through slot 55 in actuator 54. Each of flex circuits 45 includes a dielectric substrate layer 56 and conductors 58. As can be seen, conductors 58 on flex circuits 45 face one another when flex circuits 45 pass through slot 55. Thus, it can be appreciated that as the width of slot 55 is decreased, the probability of conductors 58 touching one another increases. Further, electrical interconnections between conductors 58 and actuator board 54 are made on surface 60 of the actuator board 54. Generally, such electrical interconnections are effected using solder joints. As is known, when a sufficient amount of heat is provided to solder it flows as a liquid. As shown in FIG. 5A, it is possible for excess amounts of solder to flow across the width of slot 55 and essentially electrically bridge conductors 58. It is highly undesirable for conductors 58 to be electrically coupled to one another as data errors, or other read/write failures may result. Additionally, it is important to protect the exposed side of the circuitry (conductors 58) from shorting to other circuitry or to metal support structures in drive 10. As can be seen, dielectric cover coats could significantly reduce the risk of shorting between conductors 58 in groove 44 and slot 55. However, because dielectric cover coats can only extend to the edges of flex circuits 45, dielectric cover coats do not adequately guard against solder bridging in the specific area of the actuator board interconnect and in general dielectric cover coat materials present additional problems with outgassing and increased costs.

FIG. 5B is an elevation view taken along section A—A in FIG. 4 of flex circuits 46 coupled to actuator board 54 in accordance with the present invention. As in FIG. 5A flex circuits 46 pass through slot 55 in actuator board 54 in order to electrically couple to actuator board 54 at surface 60 (also referred to herein as interconnect plane 60). Further, electrical connection of flex circuits 46 to actuator board 54 is generally effected with solder joints as is shown by solder joints 62. Additionally, as in FIG. 5A, each of flex circuits 46 includes conductors 58 which face one another as flex circuits 46 pass through groove 44 and slot 55. In FIG. 5B, there is shown an insulating spacer disposed between conductors 58, and extending past surface 60 of actuator board 54. Insulating layer 64 prevents conductors 58 from shorting to one another or other metal structures while also preventing solder 62 from wicking across slot 55 and shorting conductors 58. Preferably, insulating layer 64 is constructed from the same dielectric material as dielectric substrate 56. More preferably, such materials are polyimides.

In order to reduce costs, it is preferred that insulating layer 64 be constructed as a flap on one of circuits 46. As such, prior to insertion of circuits 46 through slot 55, insulating layer/flap 64 is folded over in order to electrically separate conductors 58 of opposing flex circuits 46. Additionally, it is preferred that dielectric substrate 56 and insulating layer/flap 64 meet at hinge 66 which is preferably constructed from a combination of dielectric material and conductor material. However, hinge 66 may be constructed from dielectric material or conductor material alone. Because hinge 66 is preferably constructed from a stackup containing the conductor material, as flap 64 is folded over, the conductor material 66 will yield such that the flap will remain the closed position. It is preferred that the conductor material be constructed from copper. Thus, it can be appreciated that the circuit can be designed with no cover coat in the flap area or even use a cover coat in conjunction with the flap. As can also be seen in FIG. 5B the flap has the advantage of being able to extend beyond the edge of the base dielectric layer 56 which cannot be done with liquid-applied cover coat materials.

Figure 6:
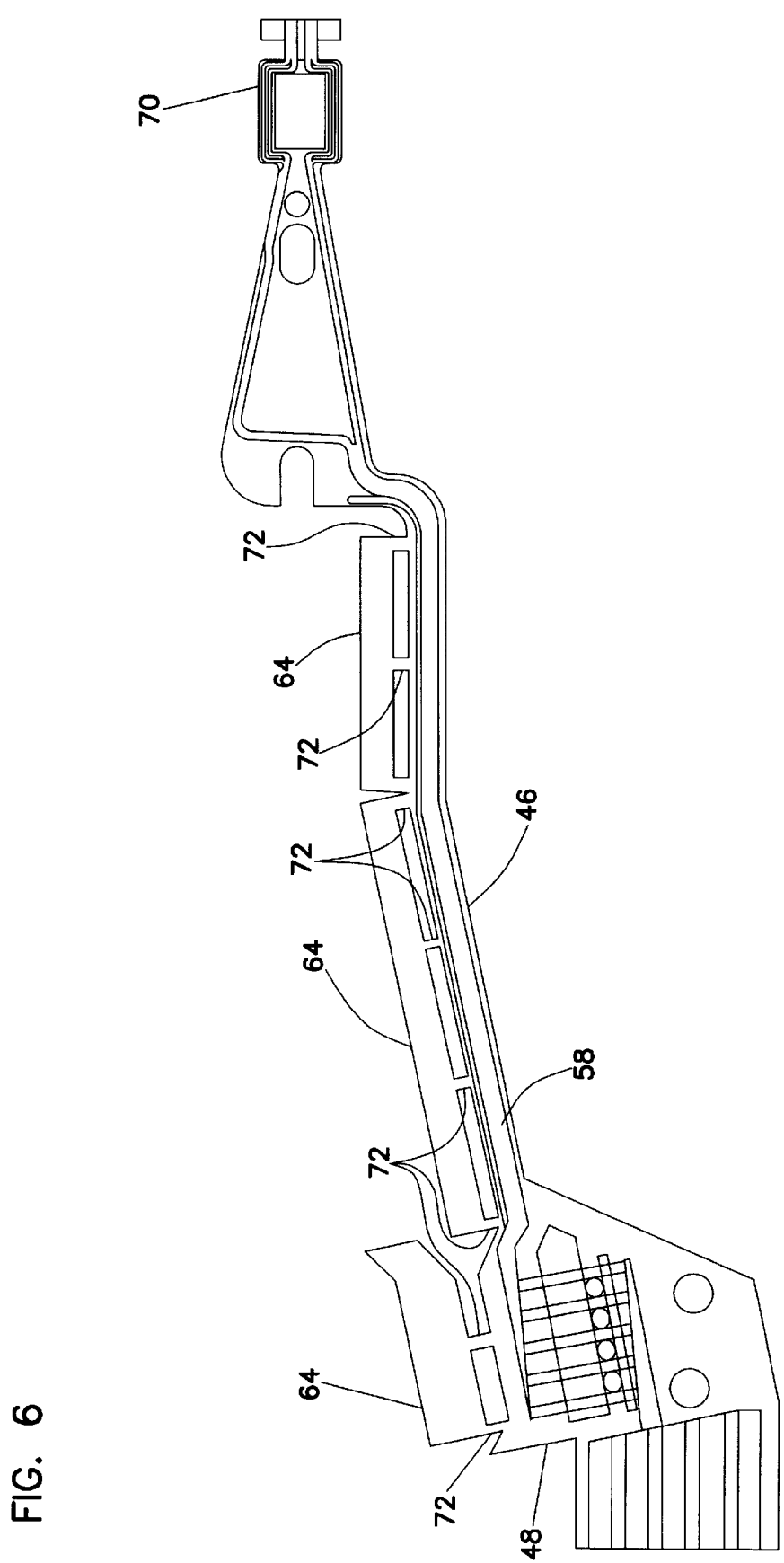
FIG. 6 is a top plan view of a flex circuit in accordance with the present invention.

FIG. 6 is a top plan view of flex circuit 46 in accordance with the present invention. Flex circuit 46 includes tail attach region 68, head attach region 70, conductors 58 and flaps 64. FIG. 6 also shows hinges 72 which couple flaps 64 to flex circuit 46. As can be appreciated, any appropriate number of hinges 72 may be used and the dimensions of hinges 72 may be varied in accordance with the present invention. In fact, the hinge may be one entire side of flex circuit 46. Thus, the use of flaps 64 along the length of flex circuit 46 can totally eliminate the need for cover coat. Further, the preferred combination of dielectric material and conductor material in the hinge regions 72 provide the advantage of the conductor material yielding after the tab is folded, while the dielectric material resists tearing, which is also important.

In conclusion, the addition of flaps 64 to flex circuits 46 in head interconnects reduces, if not eliminating the possibility of solder bridging at head stack terminations. Further, costs are reduced due to elimination of process steps involving the cover coat layer. Furthermore, the risk of chemical incompatibility from outgassing and extractables of the cover coat layer is also reduced. Finally, the removal of the cover coat layer reduces the amount of particulate contamination in the disc drive.

Although the present invention has been described with reference to preferred embodiments, workers skilled in the art will recognize that changes may be made in form and detail without departing from the spirit and scope of the invention. For example, although the present invention has been described with respect to magnetic disc drive systems, the invention may be practiced in optical disc drive systems. Additionally, the base dielectic layer need not be polyimide. Other materials such as polyester and liquid crystal polymer (LCP) may be used.

What is claimed is:

1. A disc drive for storing information on a disc, comprising:

head means for transducing information on the disc;

read/write circuitry means for reading and writing on the disc with the head; and flex circuit means for coupling the head means to the read/write circuitry means.

2. A flex circuit head interconnect for connecting a head in a disc storage system to an actuator board, the interconnect, comprising:

a base insulating layer;

at least one flexible electrical conductor attached to the base insulating layer, the at least one electrical conductor having a first end adapted to couple to the head and a second end adapted to couple the actuator board; and an insulating spacer covering at least a portion of the at least one electrical conductor, the spacer being attached to the base insulating layer and configured to fold over at least a portion of the electrical conductor.

3. The apparatus of claim 2 wherein the base insulating layer and insulating spacer are constructed from the same material.

4. The apparatus of claim 2 wherein the insulating spacer is constructed from a polyimide.

5. The apparatus of claim 2 wherein the at least one electrical conductor comprises four electrical conductors.

6. The apparatus of claim 2 wherein the spacer attaches at selected hinge portions to the base insulating layer.

7. The apparatus of claim 6 wherein the hinge portions further include conductor material such that the conductor material yields when the spacer is folded over the base insulating layer and electrical conductor.

8. The apparatus of claim 2 wherein the conductor is constructed from copper.

9. The apparatus of claim 2 wherein the at least one electrical conductor has a width less than about 80 $\mu$m.

10. A method of interconnecting disc drive heads to a matrix board comprising the steps of:

coupling a first flex circuit to a first head;

coupling a second flex circuit to a second head;

providing both flex circuits to the matrix board through a slot in the matrix board;

providing an insulating layer between the flex circuits such that the insulating layer extends beyond an interconnect plane of a matrix board; and soldering conductors of the first and second flex circuits to the actuator board.

11. A disc drive comprising:

a first rotating disc;

a second rotating disc concentric with the first rotating disc, and spaced axially therefrom;

read/write circuitry for reading data from and writing data to the first and second rotating discs;

a load arm extending between the first and second rotating discs, the load arm having a first end and a second end;

a first flexure arm coupled to the first end of the load arm;

a second flexure arm coupled to the first end of the load arm;

a first head coupled to the first flexure arm, the first head flying proximate one of the first and second rotating discs;

a second head coupled to the second flexure arm, the second head flying proximate the other of the first and second rotating discs;

a matrix board having an interconnect plane coupled to the read/write circuitry, the matrix board disposed proximate the second end of the load arm;

a first flex circuit having first conductors electrically coupling the first head to the matrix board at the interconnect plane;

a second flex circuit having second conductors electrically coupling the second head to the matrix board at the interconnect plane; and an insulating spacer disposed between the first and second conductors proximate the matrix board, the insulating spacer extending beyond the interconnect plane of the matrix board.

12. The apparatus of claim 11 wherein the insulating spacer is constructed from polyimide.

13. The apparatus of claim 11 wherein the insulating spacer is attached to one of the first and second flex circuits.

14. The apparatus of claim 13 and further comprising a second insulating spacer attached to the other of the first and second flex circuits.

15. The apparatus of claim 13 wherein the insulating spacer attaches to the one of the flex circuits at selected hinge portions.

16. The apparatus of claim 11 wherein the insulating spacer insulates substantially all of the first conductors from the second conductors.

17. The apparatus of claim 11 wherein each of the first conductors and the second conductors have a width less than about 80 $\mu$m.

18. The apparatus of claim 17 wherein the hinge portions further comprise conductor material.

19. The apparatus of claim 18 wherein the conductor material is constructed from copper.

* * * * *

UNITED STATES PATENT AND TRADEMARK OFFICE
CERTIFICATE OF CORRECTION

PATENT NO. : 6,046,886
DATED : Apr. 4, 2000
INVENTOR(S) : Himes et al.

It is certified that error appears in the above-identified patent and that said Letters Patent is hereby corrected as shown below:

On the Title page, item [54] and in column 1:

"FLEX CIRCUIT HEAD INTERCONNECT WITH INSULATING SPACER" should be --FLEX CIRCUIT HEAD INTERCONNECT WITH INSULATING SPACER AND METHOD OF APPLICATION IN DISC DRIVE--

Signed and Sealed this

Sixth Day of March, 2001

Attest:

NICHOLAS P. GODICI

Attesting Officer

Acting Director of the United States Patent and Trademark Office